(12) United States Patent
Kutsuna

(10) Patent No.: US 7,229,858 B2
(45) Date of Patent: Jun. 12, 2007

(54) SEMICONDUCTOR WAFER AND SEMICONDUCTOR DEVICE MANUFACTURING METHOD USING THE SAME

(75) Inventor: Yuji Kutsuna, Obu (JP)

(73) Assignee: Denso Corporation, Kariya (JP)

( * ) Notice: Subject to any disclaimer, the term of this patent is extended or adjusted under 35 U.S.C. 154(b) by 77 days.

(21) Appl. No.: 11/091,450

(22) Filed: Mar. 29, 2005

(65) Prior Publication Data

US 2005/0218923 A1  Oct. 6, 2005

(30) Foreign Application Priority Data

Mar. 30, 2004  (JP) ............... 2004-099876

(51) Int. Cl.
*H01L 21/332* (2006.01)
(52) U.S. Cl. .............. 438/133; 438/14; 438/106; 257/E21.511; 257/E21.521
(58) Field of Classification Search ........... 438/133, 438/106, 113, 33, 48, 68, 14, 107, 108, 194, 438/289, 460
See application file for complete search history.

(56) References Cited

U.S. PATENT DOCUMENTS

| | | | | |
|---|---|---|---|---|
| 5,191,224 A | * | 3/1993 | Tazunoki et al. | 257/724 |
| 5,390,011 A | * | 2/1995 | Theodoulou | 399/307 |
| 5,510,730 A | | 4/1996 | El Gamal et al. | 326/41 |
| 5,619,462 A | | 4/1997 | McClure | 365/201 |
| 5,994,912 A | | 11/1999 | Whetsel | 324/763 |
| 6,313,658 B1 | | 11/2001 | Farnworth et al. | 324/765 |
| 6,590,412 B2 | * | 7/2003 | Sunter | 324/771 |
| 2003/0235929 A1 | | 12/2003 | Cowles et al. | 700/117 |

FOREIGN PATENT DOCUMENTS

EP  0 579 993 A1  7/1993
JP  A-5-136243  6/1993

OTHER PUBLICATIONS

Search Report dated Feb. 15, 2007 issued from French Patent Office fro counterpart application No. 0503039000.

* cited by examiner

*Primary Examiner*—David Nhu
(74) *Attorney, Agent, or Firm*—Posz Law Group, PLC

(57) ABSTRACT

In a method of manufacturing a semiconductor device, a semiconductor wafer is prepared that includes a plurality of IC chips, each having a circuit including a terminal for applying an electrical quantity to the circuit, and a switch electrically connected to the terminal. A wire is formed between adjacent IC chips to provide a parallel or series electrical connection between the terminals of the IC chips via the switch. A test is performed to determine the operability (defective or non-defective) of each of the IC chips. The switch is then operated to provide an electrical connection between the terminals of only those IC chips that were determined to not be defective and the wire. A conduction test is performed on the circuits of the IC chips through the wire.

4 Claims, 4 Drawing Sheets

SEMICONDUCTOR WAFER AND SEMICONDUCTOR DEVICE MANUFACTURING METHOD USING THE SAME

CROSS REFERENCE TO RELATED APPLICATIONS

This application is based upon, claims the benefit of priority of, and incorporates by reference the contents of, Japanese Patent Application No. 2004-99876 filed on Mar. 30, 2004.

FIELD OF THE INVENTION

The present invention relates to a semiconductor wafer and a semiconductor device manufacturing method using the semiconductor wafer.

BACKGROUND OF THE INVENTION

A method of performing a test such as screening a plurality of IC chips formed on a semiconductor wafer before the wafer is diced has been disclosed in, for example, the method of manufacturing a semiconductor device of JP-A-5-136243.

The following description relates to such a conventional semiconductor device manufacturing method, particularly when the above screening is performed. FIG. 6 is a flowchart showing a conventional semiconductor device manufacturing process.

According to the conventional method, at step S1, a plurality of IC chips 1 are formed on a semiconductor wafer. Wires for electrically connecting the respective terminals of the IC chips to one another in parallel are formed on scribe lines on the wafer. The wires thus formed are electrically connected to the terminals of the respective IC chips.

FIG. 7 shows an exemplary IC chip 1 formed on the semiconductor wafer and wires 2 formed on scribe lines. For example, each chip 1 has a power supply wire, a GND wire, a first input signal wire and a second input signal wire. The terminals 3a, 3b, 3c, 3d of the wires are electrically connected to corresponding wires 2a, 2b, 2c, 2d formed on the scribe lines for supplying power and providing signal communication to each IC chip 1.

Returning to FIG. 6, subsequently, at step S2 the semiconductor wafer having the IC chips 1 formed thereon is prepared. At step S3, the IC chips 1 on the semiconductor wafer are inspected to determine whether the IC chips on the semiconductor wafer are non-defective or defective.

Subsequently, a screening step S5 is performed. In this step, a voltage is simultaneously applied to the respective terminals 3 of all the IC chips 1 through the wires 2 on the scribe lines. As described above, the screening is simultaneously performed on all the IC chips 1 on the semiconductor wafer.

More particularly, the screening means 100%-inspection is performed so that IC chips 1 which contain potential defects and may become defective articles in the future are determined to be non-defective through the above inspection by using various kinds of tests. These IC chips judged to be defective are removed from the IC chips 1.

Regarding the tests used to judge whether the chip is defective, a high temperature operation test at a fixed time referred to as a burn-in test, for example, may be performed on all the chips to thereby specify IC chips 1 having initial operation failure.

Then, in a dicing step, the semiconductor wafer is cut out (diced) into a plurality of parts corresponding to the respective IC chips. IC chips which are determined to be defective in the characteristic inspection step S3 or the screening step S5 are removed. Thereafter, the remaining IC chips are subjected to a packaging step, etc. and finally semiconductor devices are completed.

As described above, all the IC chips 1 on the semiconductor wafer are electrically connected to one another in parallel. Therefore, when a short mode fault such as short-circuit between an internal power source wire and an internal GND wire occurs in some IC chips 1, excessive current flows into the IC chips 1 under the fault state in the screening step, and thus it is impossible to apply a desired voltage to other non-defective IC chips 1. Accordingly, it has been difficult in the conventional method to perform screening on all the IC chips together.

Such a problem as described above occurs not only in the screening step, but also in a conduction test in which voltages are applied to the plurality of IC chips 1 on the wafer to check the operation of the IC chips 1. Furthermore, such a problem is an even greater concern in tests, such as screening, under which the number of targets to be simultaneously tested is larger.

SUMMARY OF THE INVENTION

In view of the foregoing, it is an object to provide a semiconductor wafer to which a conduction test can be simultaneously performed on a plurality of IC chips formed thereon, and also a semiconductor device manufacturing method using the semiconductor wafer.

In order to attain the above object, a semiconductor device manufacturing method according to a first aspect includes preparing a semiconductor wafer having a plurality of IC chips, each of which includes a circuit, terminals and a switch, and wires which are formed between respective adjacent IC chips and electrically connected to respective terminals through each switch; performing a first switch switching step of switching the switches of the plurality of chips so that the wires are conducted to only the terminals of IC chips which are determined to be non-defective after determined whether each of the plurality of IC chips is non-defective or defective; and performing a conduction test on the circuits of the plurality of IC chips through the wires.

As described above, according to the first aspect, before the conduction test is performed, the switches are switched so that only the terminals of the IC chips which are determined to be non-defective are conducted to the wires. Therefore, desired voltages can be applied to only the chips which are determined to be non-defective.

As a result, according to the first aspect, even when a short mode fault occurs in some of the plurality of IC chips formed on a semiconductor wafer, a conduction test can be simultaneously performed on other IC chips in which no fault occurs.

Furthermore, according to a second aspect, a second switch switching step is performed between the step of performing the conduction test and a dicing step. In the second switching step, the switches of IC chips determined to be non-defective from the determination of whether each of the plural chips is non-defective or defective are switched so that the terminals of the IC chips determined to be non-defective are non-conducted to the wire.

Normally, the semiconductor device manufacturing process has a dicing step of cutting the semiconductor wafer into every IC chip. However, there may occur a case where a wire on a scribe line is short-circuited to an adjacent wire, a lead frame or the like. In this case, the wire on the scribe line adversely affects the internal operation of the chip.

Therefore, according to the second aspect, by turning off the switch after the screening step, a non-conduction state is established between each wire and each terminal of the circuit.

Accordingly, the portion from the switch to the wire and the circuit can be electrically separated from each other. As a result, the electrical problem occurring in the IC chips due to dicing can be suppressed.

According to a third aspect, the switch may be designed so that memory transistors are turned on or off at a read-out time of the memory transistors in accordance with whether the memory transistors are under write-in state or erase-state, whereby the switch is turned on or off.

In the switch switching step, the switches of the plurality of IC chips are switched by performing writing or erasing on the memory transistors, and in the conduction test step, the conduction test is performed while performing the read-out operation on all the memory transistors contained in the plural IC chips.

The switch is formed in the area of the IC chip, and the terminals for applying voltages to the circuit are formed between the adjacent IC chips through the switch and electrically connected to the wires through which the terminals of the plural IC chips are electrically connected to one another in parallel or in series.

Further, the semiconductor device manufacturing method can be implemented by using the semiconductor wafer of the first to third aspects.

The switch may be an MOS transistor formed in each IC chip area of the semiconductor wafer.

Furthermore, the switch may be a switch having memory transistors designed to be turned on or off at the read-out time thereof in accordance with whether the memory transistors are under write-in state or erase-state, whereby the switch is turned on or off.

For example, the memory transistor may be directly used as a switch, or an MOS transistor whose gate is connected to a memory transistor may be used as a switch.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE PREFERRED EMBODIMENTS

Preferred embodiments according will be described hereunder with reference to the accompanying drawings.

(First Embodiment)

Figure 1:
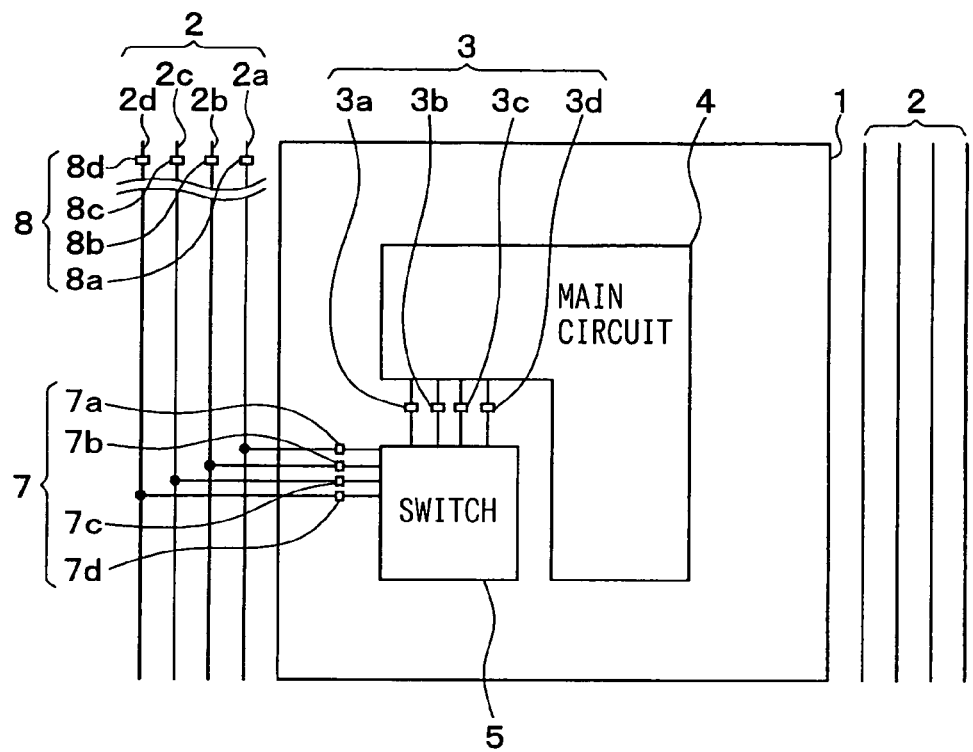
FIG. 1 is a circuit diagram illustrating an exemplary connection between an IC chip formed on a semiconductor wafer and wires formed on a scribe line according to a first embodiment.
Figure 7:
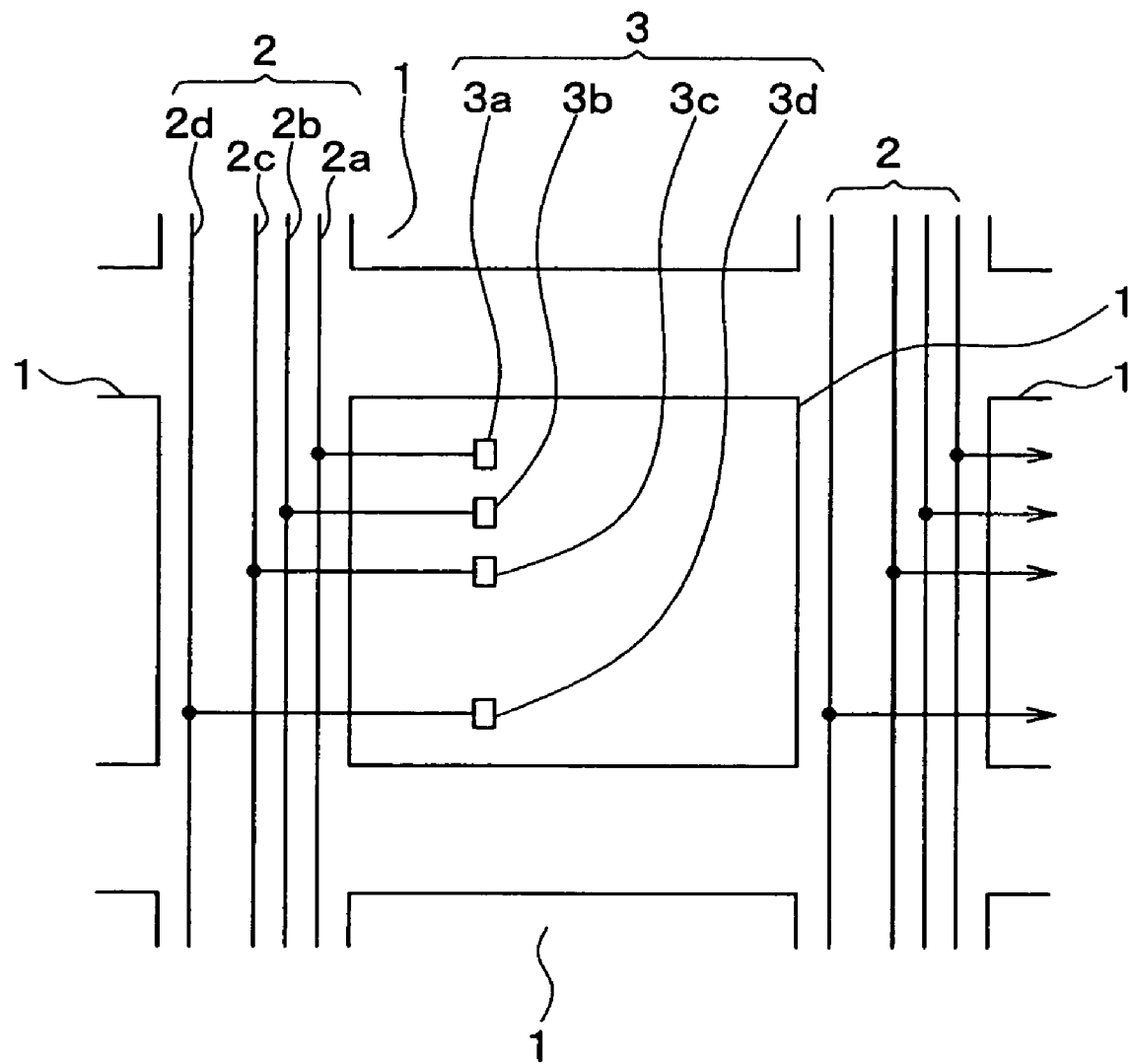
FIG. 7 is a circuit diagram illustration a connection between an IC chip formed on a semiconductor wafer and wires formed on a scribe line according to the prior art.

FIG. 1 is a circuit diagram illustrating an exemplary connection between an IC chip 1 formed on a semiconductor wafer and wires 2 formed on a scribe line according to a first embodiment. In FIG. 1, the same constituent elements as FIG. 7 are represented by the same reference numerals.

A difference between the semiconductor wafer of this embodiment and the conventional semiconductor wafer described above is that the terminals 3 of each IC chip 1 are electrically connected to wires 2 on a scribe line through a switch 5 formed in each IC chip 1.

The semiconductor wafer of this embodiment has the IC chips 1 and the wires 2 formed on the scribe lines.

As shown in FIG. 1, the IC chip 1 is equipped with a main circuit 4 and a switch 5. The main circuit 4 is a part used as an article. Although not shown for ease of illustration, the main circuit 4 is equipped with various kinds of semiconductor elements such as MOS transistors, memory transistors, etc. formed on a semiconductor substrate. The main circuit 4 has a power source wire, a GND wire, a first input signal wire and a second input signal wire. The main circuit 4 constitutes the circuit.

The IC chip 1 has terminals 3 of the main circuit 4. The terminals 3a, 3b, 3c, 3d of the terminals 3 are electrically connected to the main source wire, the GND wire, the first input signal wire and the second input signal wire of the main circuit 4, respectively. The terminals 3 of the main circuit 4 are used to apply a power source voltage, signal voltages, etc. to the power source wire, the GND wire, the first input signal wire and the second input signal wire of the main circuit 4. These terminals 3 of the main circuit 4 constitute the terminal.

Figure 2:
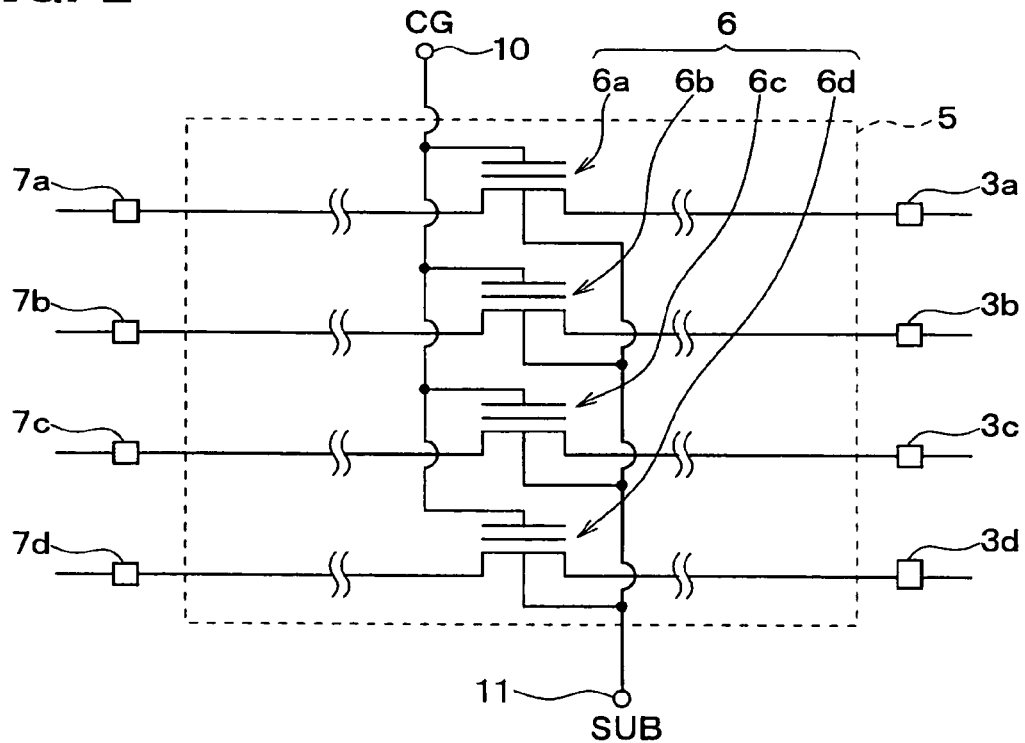
FIG. 2 is a circuit diagram showing an internal construction of the switch shown in FIG. 1.

FIG. 2 shows the internal construction of the switch 5. The switch 5 is used for screening during the semiconductor device manufacturing process. As shown in FIG. 2, the switch 5 has electrically rewritable memory transistors 6 formed on the semiconductor substrate. The switch 5 utilizes the property of the memory transistors in which current flows or no current flows in the memory transistors in accordance with the write-in/erase state of the memory transistors 6 during read-out operation of the memory transistors 6. The memory transistors 6 are the same type as the memory transistors constituting the main circuit 4. Each memory transistor 6 may be, for example, a flash memory having a two-layered gate structure.

As shown in FIGS. 1 and 2, screening terminals 7 (7a to 7d) are formed on the IC chip 1. Both the ends of the switch 5 are connected to the screening terminals 7 and the terminals 3 of the main circuit 4.

That is, as shown in FIG. 2, both the ends of one memory transistor 6a are connected the terminal 3a of the main circuit 4 and the screening terminal 7a respectively in the switch 5. Likewise, both the ends of each of the other memory transistors 6b, 6c, 6d are connected to the terminal 3b, 3c, 3d of the main circuit 4 and the screening terminal 7b, 7c, 7d. In the memory transistors 6, the electrodes connected to the screening terminals 7 serve as drains, and the electrodes connected to the terminals 3 of the main circuit 4 serve as sources.

Furthermore, as shown in FIG. 2, the control gates of the respective memory transistors 6a to 6d and the substrate are electrically connected to the terminal 10 for the control gates and the terminal 11 for the substrate. The terminal 10 for the control gates and the terminal 11 for the substrate are provided on the IC chip 1, which is omitted from the illustration of FIG. 1 for ease of illustration.

The respective memory transistors 6a to 6d switch between electrical conduction and non-conduction at each of the screening terminals 7 and the terminals 3 of the main circuit 4.

As shown in FIG. 1, the wires 2 on the scribe line contain a power source wire 2a for supplying power, ground and an input signal to each IC chip 1, a GND wire 2b, a first input wire 2c and a second input signal wire 2d. These wires 2 are disposed in the area between adjacent IC chips 1. These wires 2 are formed on the surface of the substrate and preferably constructed by multi-layered wires 2 formed of metal such as aluminum or the like.

As described above, the terminals 3 (3a to 3d) of all the IC chips 1 which are used to satisfy the same purpose are electrically connected to one another in parallel by the wires 2 on the scribe lines. However, the electrical connection of the terminals 3 of the main circuit 4 is not limited to a parallel connection, but may also be a series connection.

Figure 3:
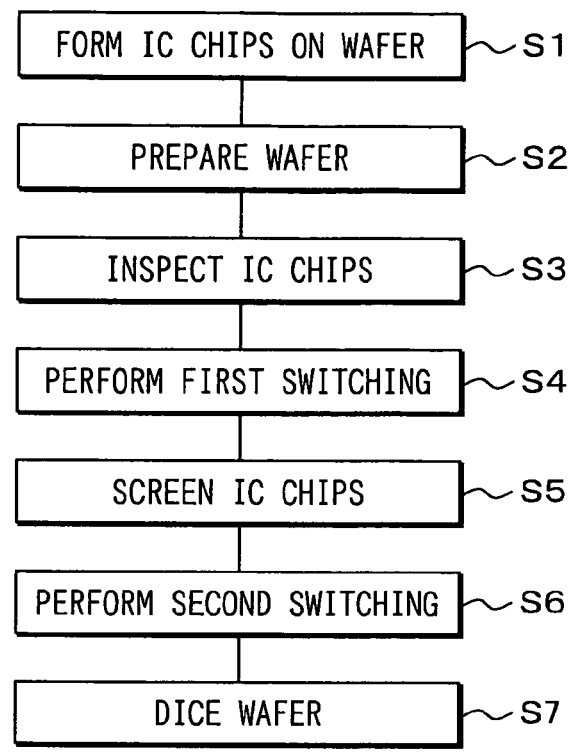
FIG. 3 is a flowchart of a semiconductor device manufacturing process according to the first embodiment.

Next, a semiconductor device manufacturing method using the semiconductor water having the above structure will be described. FIG. 3 is a flowchart showing the semiconductor device manufacturing process of this embodiment. Some of the differences between the semiconductor device manufacturing process of this embodiment and the conventional approach are, that the switch 5 is formed in the IC chip 1 in an IC chip forming step S1 and also that a first switch switching step S4 and a second switch switching step S6 are performed.

In the step S1 of forming the IC chips on the semiconductor wafer, the IC chips 1 are formed on the semiconductor wafer and the wires 2 are formed on the scribe lines by well-known methods of film formation, patterning, impurities doping, etc.

At this time, the memory transistors 6 constituting the switch 5 and the memory transistors constituting the main circuit 4 are simultaneously formed. The wires 2 on the scribe lines and the multi-layered wires of IC chips 1 are also simultaneously formed.

Accordingly, the number of steps needed for the manufacturing process can be reduced as compared with a case where the switch 5 and the memory transistors constituting the main circuit 4 are separately formed and a case where the wires 2 on the scribe lines and the multi-layered wires of the IC chips 1 are separately formed.

When all the switches 5 formed on the IC chips 1 are not turned off after the IC chips are formed on the semiconductor wafer, all the switches 5 on the semiconductor wafer are turned off.

Figure 4:
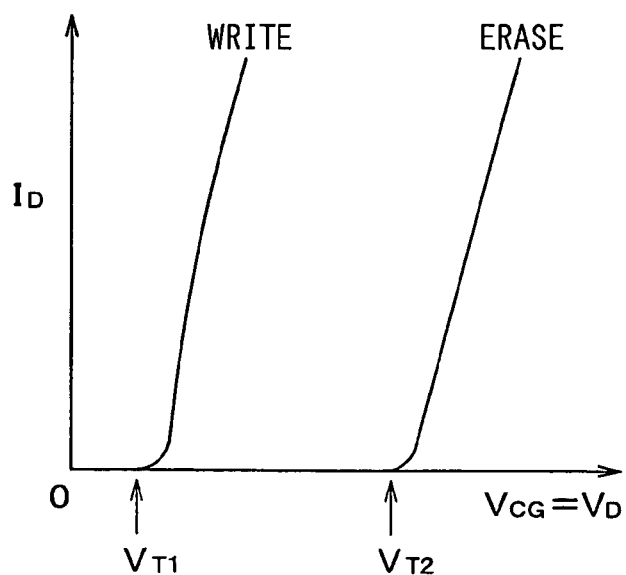
FIG. 4 is a diagram showing a threshold voltage at the writing and erasing time of the memory transistors shown in FIG. 2.

Here, the operation of the memory transistors 6 of this embodiment will be described. FIG. 4 shows threshold voltages $V_{T1}$, $V_{T2}$ when writing and erasing are performed on the memory transistors 6 of this embodiment.

In this embodiment, flash memories are used as the memory transistors 6. According to this embodiment, as shown in FIG. 4, when the threshold voltage of the memory transistors 6 is small, $V_{T1}$ is set to a write state, and when the threshold voltage of the memory transistors 6 is large, $V_{T2}$ is set to an erase state.

When writing is performed on the memory transistors 6, 0V is applied to the substrate and the control gates and a high voltage is applied to the sources while the drains are set to the open state. Furthermore, when erasing is performed on the memory transistors 6, 0V is applied to the sources of the memory transistors 6 and the substrate and the control gates and the drains are set to the same potential, thereby electrically erasing the memory transistors 6. Alternatively, ultraviolet rays may be irradiated to the memory transistors 6 to thereby erase the memory transistors 6.

When reading is performed on the memory transistors 6, the intermediate voltage between the $V_{T1}$ and $V_{T2}$ is applied to the control gates, 0V is applied to the sources and the substrate and a low voltage is applied to the drains. At this time, if the memory transistors 6 are set to the write state, current flows in the memory transistors 6. On the other hand, if the memory transistors 6 are set to the erase state, no current flows in the memory transistors 6.

Accordingly, when all the switches 5 on the semiconductor wafer are set to the OFF-state, erasing is performed on all the memory transistors 6 on the semiconductor wafer. That is, in all the IC chips 1 on the semiconductor wafer, 0V is applied to the terminals 3 of the main circuits connected to the sources of the memory transistors 6 and the terminals 11 for the substrate, high voltages are applied to the terminals 10 for the control gates and the screening terminals 7 connected to the drains of the memory transistors 6 to electrically erase the memory transistors 6, or ultraviolet rays are irradiated to all the IC chips 1 to erase the memory transistors.

At this time, electrical erasing or erasing based on irradiation of ultraviolet rays is performed on the respective terminals 3, 7, 10 and 11 of all the IC chips 1 on the semiconductor wafer at the same time by using a device for applying voltages.

As described above, the switches 5 of all the IC chips 1 are turned off while the memory transistors 6 constituting the switches 5 are set to the erase state under which no current flows therethrough at the read-out time.

The semiconductor wafer having the above structure is manufactured according to the method as described above. The operation of turning off the switches 5 of all the IC chips 1 is not limited to the above process, and it may be performed in the step of preparing the semiconductor wafer before the characteristic inspecting step S3.

Subsequently, the step S2 of preparing the semiconductor wafer having the above structure is performed, and then the inspecting step S3 of the IC chips 1 on the semiconductor wafer is performed. These steps S2 and S3 respectively constitute preparing the semiconductor wafer and determining whether the plural IC chips are non-defective or defective.

In the inspecting step S3 of the IC chips 1 on the semiconductor wafer, the IC chips formed on the semiconductor wafer are subjected to inspection one by one with a probe to determine whether each of all the IC chips is non-defective or defective. At this time, IC chips in which a short mode fault such as a short-circuit between the internal power source wire and the internal GND wire or the like occurs are determined to be defective.

Mapping data on non-defective articles or defective articles are prepared on the basis of the above determination and stored in the probe.

Subsequently, a first switch switching step S4 is performed. The switches 5 of only the IC chips determined to be non-defective articles are switched from OFF-state to ON-state on the basis of the mapping data stored in the probe. This step constitutes the first switch switching step.

At this time, the memory transistors 6 of an IC chips 1 determined to be a non-defective article is electrically connected to a device for performing writing/erasing on the memory transistors 6 such as the probe or the like on the basis of the mapping data stored in the probe. Then, the writing operation is performed on the memory transistors 6 of the IC chips 1 determined to be non-defective articles for every IC chip 1.

With respect to the IC chips 1 determined to be non-defective articles, for example, 0V is applied to the terminals 10 for the control gates and the terminals 11 for the substrate, and a high voltage is applied to the terminals 3 of the main circuits connected to the sources of the memory transistors 6 while the screening terminals 7 connected to the drains of the memory transistors 6 are set to the open state.

As described above, only the main circuits 4 of the IC chips 1 determined to be non-defective articles in the inspecting step S3 of the IC chips 1 on the semiconductor wafer are conducted to the wires 2 formed on the scribe lines.

Subsequently, the screening step S5 is performed. In this step, the screening terminals 7a to 7d of all the IC chips 1 are electrically connected to a device for performing the screening operation, and a conduction test, such as, for example, the burn-in operation is performed by applying voltages to the power source wire, the GND wire and the first and second input signal wires in the main circuit 4 of each of the IC chips 1 on the semiconductor wafer. This step constitutes performing the conduction test.

At this time, a device which can simultaneously apply voltages to the gate electrodes of all of the plurality of IC chips 1, the substrate, etc. is used as the device for performing the screening operation. The terminals 10 for the control gates and the terminals 11 for the substrate in all the IC chips 1 are also electrically connected to the device for performing the screening operation.

When the burn-in is performed, the burn-in operation is performed while the intermediate voltage between $V_{T1}$ and $V_{T2}$ is applied to the control gates of the memory transistors 6 in all the IC chips 1, and 0V is applied to the substrate of the memory transistors 6.

In this case, a predetermined voltage is applied through the wires 2 to the drains of the memory transistors 6 connected to the screening terminals 7, and a voltage lower than the voltage applied to the drains is applied to the sources of the memory transistors 6 which are electrically connected to the main circuits 4.

Therefore, in the burn-in operation, the memory transistors 6 constituting the switch 5 of each IC chip are set to a state where the reading operation is performed.

Since the memory transistors 6 of the IC chips determined to be non-defective articles are under the writing state, in which current flows between the source and drain of each memory transistor 6 in the burn-in operation. That is, the switch 5 is turned on in each IC chip 1 determined to be a non-defective article. Accordingly, in the burn-in operation, the voltage is applied from the device for performing screening operation through the wires 2 to the main circuits 4 of the IC chips 1 determined to be non-defective articles.

On the other hand, the memory transistors 6 of the IC chips 1 determined to be defective articles are under the erase state, in which no current flows between the source and drain of each of the memory transistors 6 in the burn-in operation. That is, in the IC chips 1 determined to be defective articles, the switches 5 are turned off. Accordingly, no voltage is applied to the main circuit 4 of the IC chips 1 determined to be defective articles in the burn-in operation.

As described above, the screening is performed on the IC chips 1 on the semiconductor wafer.

The memory transistors 6 constituting the switches 5 in this embodiment are designed to have the same structure as the general memory transistor. However, in the screening step S5, the voltage applied to the memory transistors 6 of the switches 5 is set to be larger than a normal voltage applied to a memory transistor used as a memory. Therefore, the memory transistors 6 of the switches 5 may be designed so that a voltage larger than a normal voltage may be applied thereto.

After the screening step S5, a second switch switching step S6 is performed. In this step, the switch 5 of each IC chip 1 determined to be a non-defective article is switched from an ON-state to an OFF-state. This step constitutes the second switch switching step.

At this time, erasing is performed on the memory transistors 6 constituting the switches 5 of the IC chips 1 determined to be non-defective articles.

For example, 0V is applied to the terminals 3 of the main circuits connected to the sources of the memory transistors 6 and the terminals 11 for the substrate in all the IC chips 1 determined to be non-defective articles, high voltages are applied to the terminals 10 for the control gates and the screening terminals 7 connected to the drains of the memory transistors 6 to carry out the electrical erasing operation, or ultraviolet rays are irradiated to all the IC chips 1 to carry out the erasing operation.

At this time, the electrical erasing operation or the ultraviolet irradiation is performed by using the device for applying voltages to the respective terminals 3, 7, 10, 11 of all the IC chips 1 on the semiconductor wafer at the same time.

Thereafter, the dicing step S7, etc. is performed as in the case of the conventional semiconductor device manufacturing method.

Next, a main feature of this embodiment will be described. As described above, in this embodiment, the semiconductor wafer is structured so that various terminals 3 of each IC chip 1 and the wires 2 on the scribe line are electrically joined to each other through the switch 5 formed in the IC chip 1.

In the semiconductor device manufacturing process, before the screening step S5, the switches 5 are switched in the first switch switching step S4 so that only the terminals 3 of the main circuits 4 of the IC chips 1 determined to be non-defective articles in the inspecting step S3 of the IC chips 1 on the semiconductor wafer are conducted to the wires 2 on the scribe lines.

Accordingly, even when all the IC chips 1 are connected to one another in parallel on the semiconductor wafer and a short mode fault occurs in any IC chip 1, a voltage having a desired voltage value can be applied to all the IC chips 1 determined to be non-defective articles in the screening step S5.

As a result, the conduction test can be performed on a plurality of IC chips 1 formed on a semiconductor wafer.

Furthermore, in the case of the conventional semiconductor wafer described in the background, metal wires constituting the wires 2 on the scribe lines may be short-circuited to adjacent metal wires, lead frames or the like when the semiconductor wafer is cut in the dicing step S7.

IC chips 1 determined to be non-defective articles in the screening step S5 may become defective articles after passing through the dicing step S7 when such a short-circuit occurs in the conventional wafer. Furthermore, even when IC chips 1 are not determined to be defective by the inspection before they are shipped as products, they may adversely affect the internal operation of the IC chips in the future.

On the other hand, according to the present embodiment, after the screening step S5 and before the dicing step S7, the memory transistors 6 of all the IC chips 1 determined to be non-defective articles are turned off in the second switch switching step S6. That is, the wires 2 on the scribe lines and the terminals 3 of the main circuits 4 are set to the non-conduction state.

Accordingly, the portion from the switch 5 to each wire 2 on the scribe line can be electrically separated from the main circuit 4. As a result, occurrence of the electrical problem occurring in the IC chip 1 due to dicing can be suppressed, and the reliability of products can be enhanced.

(Second Embodiment)

Figure 5:
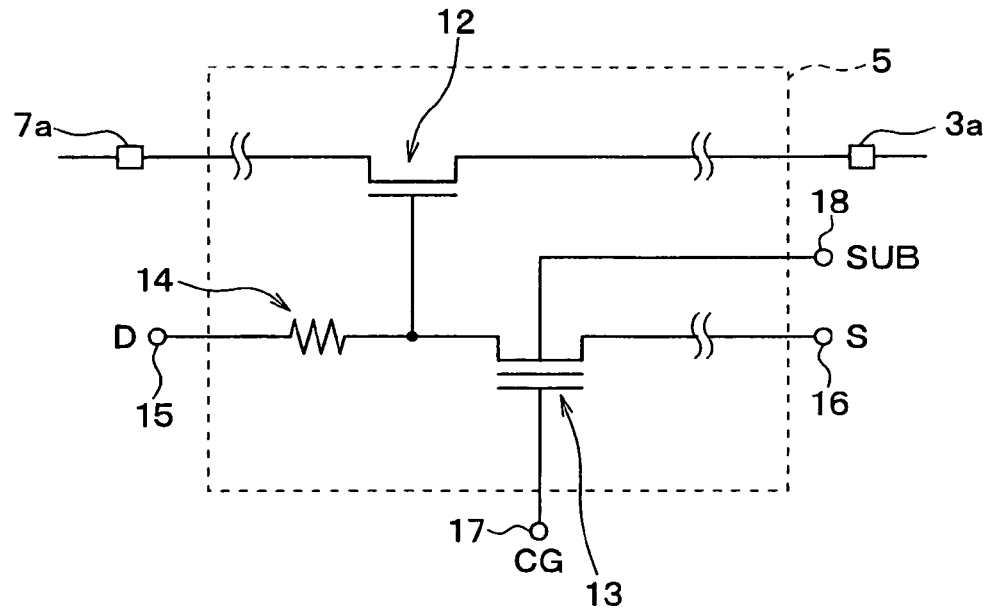
FIG. 5 is a diagram showing an internal construction of a switch according to a second embodiment.
Figure 6:
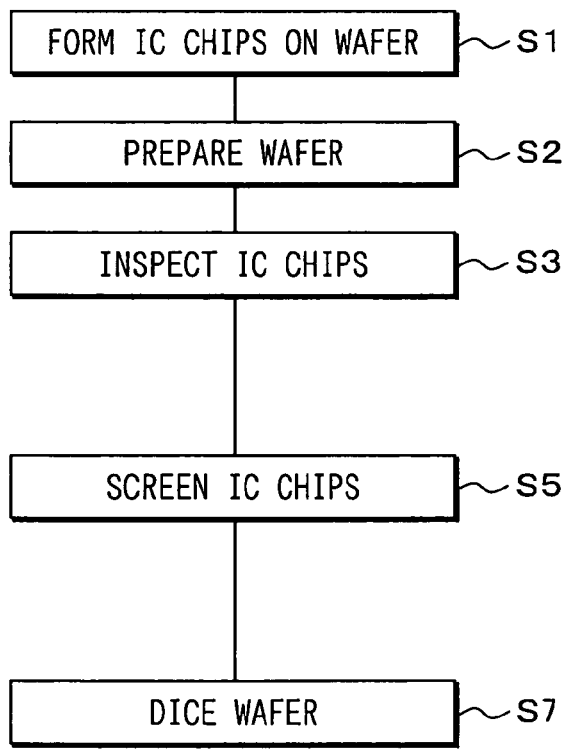
FIG. 6 is a flowchart of a conventional semiconductor device manufacturing process.

FIG. 5 shows the internal construction of the switch 5 of a second embodiment. In the first embodiment, the switches were directly implemented as memory transistors 6. However, a transistor 12 whose gate voltage is controlled by a memory transistor 13 may also be used to implement the switch 5.

As shown in FIG. 5, the switch 5 of this embodiment is equipped with a MOS transistor 12 and a memory transistor 13. The MOS transistor 12 is a P-channel type MOS transistor, and has the same structure as the MOS transistor formed in the main circuit 4. Furthermore, the MOS transistor 12 is designed so that it is turned on when the voltage applied to the gate thereof is low and turned off when the voltage is high.

The memory transistor 13 is similar to the memory transistor 6 of the first embodiment, and it has the same structure as the memory transistor formed in the main circuit 4.

Although only a single pair of the MOS transistor 12 and memory transistor 13 is shown in FIG. 5, the switch 5 is actually equipped with MOS transistors 12 and memory transistors 13 whose pair number corresponds to the number of the terminals 3 of the main circuit 4. In this embodiment, the switch 5 is equipped with four pairs of MOS transistors 12 and memory transistors 13 in one IC chip 1.

As shown in FIG. 5, the drain and source of one MOS transistor 12 are electrically connected to one screening terminal 7a and the terminal 3a of one main circuit 4, respectively. The gate of the MOS transistor 12 is electrically connected to the drain of the memory transistor 13.

A resistor 14 is connected between the drain of the memory transistor 13 and the power source (not shown) connected to the terminal 15 for the drain.

Therefore, in the read-out operation of the memory transistor 13, a low voltage is applied to the gate of the MOS transistor 12 when the memory transistor 13 is turned on. This low voltage corresponds to a voltage under which the MOS transistor 12 is turned on, that is, an ON-voltage.

On the other hand, in the reading operation, when the memory transistor 13 is turned off, a high voltage is applied to the gate of the MOS transistor 12. This high voltage corresponds to a voltage under which the MOS transistor 12 is turned off, that is, OFF-voltage.

As described above, the switch 5 is designed so that the magnitude of the gate voltage of the MOS transistor 12 is determined in accordance with an ON/OFF of the memory transistor 13.

As shown in FIG. 5, in the memory transistor 13, the drain, the source, the control gate and the substrate are electrically connected to the drain terminal 15, the source terminal 16, the control gate terminal 17 and the substrate terminal 18. Although not shown for ease of illustration, the terminals 15 to 18 are equipped to each IC chip The switch 5 of this embodiment utilizes the property that current or no current flows in accordance with the writing/erasing state of the memory transistor in the read-out operation of the memory transistor 13. In the switch 5 of this embodiment, current or no current is made to flow between the source and drain of the MOS transistor 12 by applying a voltage or no voltage to the gate of the MOS transistor 12 by using the above property. That is, in this switch 5, the conduction/non-conduction state of the MOS transistor 12 is controlled by the memory transistor 13.

Next, the semiconductor device manufacturing method according to this embodiment will be described. The manufacturing method of this embodiment is achieved by altering the method of forming the switches 5 in the step S1 of forming the IC chips on the semiconductor wafer and the method of switching the switches in the switch switching steps S4, S6. The other manufacturing steps and the flow of the manufacturing process are the same as the first embodiment. Accordingly, only the different steps from the first embodiment will be mainly described.

Specifically, in the step S1 of forming the IC chips on the semiconductor wafer, the memory transistors 13 and the MOS transistors 12 in the switches 5 are formed simultaneously with the MOS transistors and the memory transistors constituting the main circuits 4.

When the all the switches 5 on the semiconductor wafer are turned off after the IC chips 1 on the semiconductor wafer are formed, erasing is performed on all the memory transistors 13 on the semiconductor wafer.

In this embodiment, 0V is applied to the source terminals 16 and the substrate terminals 18 of the memory transistors 13 in all the IC chips 1 on the semiconductor wafer, and high voltages are applied to the drain terminals 15 and the control gate terminals 17 of the memory transistors 13 to carry out the electrical erasing operation. Alternatively, ultraviolet rays are irradiated on all the IC chips 1 to carry out the erasing operation.

In the first switch switching step S4, writing is performed on the memory transistors 13 of the IC chips 1 determined to be non-defective articles for every IC chip 1. Specifically, with respect to the IC chips 1 determined to be non-defective articles, 0V is applied to the control gate terminals 17 and the substrate terminals 18 of the memory transistors 13, and a high voltage is applied to the source terminals 16 of the memory transistors 13 while the drain terminals 15 of the memory transistors 13 are set to the open state.

In the screening step S5, the intermediate voltage between $V_{T1}$ and $V_{T2}$ is applied to the control gate terminals 17 of the memory transistors 13 in all the IC chips 1, 0V is applied to the source terminals 16 and the substrate terminals 18 of the memory transistors 13 and the burn-in operation is performed while a low voltage is applied to the drain terminals 15 of the memory transistors 13.

At this time, the memory transistor 13 of IC chips 1 determined to be non-defective articles are under the writing state. These memory transistors 13 are turned on and an ON-voltage is applied to the gate of the MOS transistor 12 in the burn-in operation. Accordingly, the MOS transistor 12 is turned on, that is, the switch 5 is turned on.

Therefore, in this embodiment, the voltage is applied from the device for performing screening through the wires 2 to the main circuits 4 of the IC chips 1 determined to be non-defective articles in the burn-in operation.

On the other hand, the memory transistors 13 of the IC chips determined to be defective articles are under the erase state. These memory transistors 13 are turned off and the OFF-voltage is applied to the gates of the MOS transistors 12 in the burn-in operation. Accordingly, the MOS transistors 12 are turned off, that is, the switches 5 of the IC chips 1 determined to be defective articles are turned off.

Therefore, in the burn-in operation, no voltage is applied to the main circuits 4 of the IC chips 1 determined to be defective articles.

In the second switch switching step S6, 0V is applied to the source terminals 16 and the substrate terminals 18 in all the IC chips 1 determined to be non-defective articles, and high voltages are applied to the control gate terminals 17 and the drain terminals 15 to carry out the electrical erasing operation, or ultraviolet rays are irradiated on all the IC chips on the semiconductor wafer.

As described above, erasing is performed on the memory transistors 13 constituting the switches 5 of the IC chips 1 determined to be non-defective articles.

The same effect as the first embodiment can be achieved by using the transistor 12 as the switch 5 whose gate voltage is controlled by the memory transistor 13 as in the case of this embodiment.

In this embodiment, the MOS transistors 12 constituting the switches 5 are implemented by the P-channel type MOS transistors. However, N-channel type MOS transistors may be used in place of the P-channel type MOS transistors.

(Other Embodiments)

(1) In the first and second embodiment, when the threshold voltage of the memory transistors 6, 13 is small, $V_{T1}$ is set to the writing state, and when the threshold voltage is large, $V_{T2}$ is set to the erasing state. However, conversely, when the threshold voltage is small, $V_{T1}$ may be set to the erasing state while when the threshold voltage is large, $V_{T2}$ is set to the writing state.

(2) In each of the above embodiments, the flash memory is used as the memory transistor 6, 13. However, the memory transistor is not limited to the flash memory, but it may be another semiconductor memory such as EEPROM or the like.

(3) In each of the above embodiments, the MOS transistor 12 whose gate is controlled by the memory transistor 6, 13 is used as the switch 15. However, any member may be used as the switch 5 insofar as it can turn on only a chip determined to be a non-defective article in the screening operation.

(4) In each of the above embodiments, the screening switch 5 is equipped to the IC chip 1 separately from the main circuit 4. However, a semiconductor element such as a MOS transistor, a memory transistor or the like equipped in the main circuit 4 may be used as the switch 5.

In this case, the IC chip 1 is designed so that the terminals 3 of the main circuit 4 and the screening terminals 7 are electrically connected to one another through the memory transistors which do not work in the screening operation. In this construction, screening can be performed on all the IC chips 1 on the semiconductor wafer at the same time.

(5) In each of the above embodiments, in the first switch switching step S4, the switches 5 of the IC chips 1 determined to be non-defective articles are switched from an OFF-state to the ON-state for every IC chip 1. However, the switches 5 of all the IC chips 1 determined to be non-defective articles on the semiconductor wafer may be switched from the OFF-state to the on ON-state together. In this case, the switching operation of the switches 5 is performed on all the IC chips 1 determined to be non-defective articles on the semiconductor wafer by using a device which can simultaneously apply voltages.

(6) In each of the above embodiments, after the inspection is performed on all the IC chips 1 on the semiconductor wafer in the inspection step S3, the switches 5 of all the IC chips 1 determined to be non-defective articles are switched to ON-state in the first switch switching step S4. However, the inspecting step S3 and the first switch switching step S4 may be alternately performed.

That is, after the inspection is performed on a particular IC chip 1 of the plurality of IC chips 1 on the semiconductor wafer, if the IC chip 1 thus inspected is determined to be a non-defective article, writing may be subsequently performed on the memory transistor 6, 13 constituting the switch 5 of that particular IC chip 1.

(7) In each of the above embodiments, the screening terminals 7a to 7d are electrically connected to the device for performing the screening operation in the screening step S5. However, in place of the screening terminals 7a to 7d, the terminals 8, 8a, 8b, 8c, 8d of the wires 2 on the scribe line shown in FIG. 1 or the terminals 3a to 3d of the main circuits 4 may be electrically connected to the device for performing the screening operation.

However, when the terminals 3 of the main circuit 4 formed in the IC chip 1 are electrically connected to the device for performing the screening operation, it is required that the IC chip 1 thus connected is a non-defective article.

(8) In each of the above embodiments, the screening terminals 7 are provided to the IC chips 1 on the semiconductor wafer. However, the screening terminals 7 of the IC chips 1 may be omitted. When the screening terminals 7 of the IC chips 1 are omitted as described above, the area of each chip can be reduced as compared with the case where the screening terminals 7 are provided to the IC chips 1.

(9) In each of the above embodiments, after the semiconductor wafer is manufactured, the semiconductor device is manufactured by using the semiconductor wafer thus manufactured. However, the semiconductor device may be manufactured by a semiconductor wafer which is manufactured in advance.

(10) In each of the above embodiments, the screening step is performed. The invention is not limited to the screening step, and it may be applied to the entire conduction test in which a voltage is applied to plural IC chips 1 under wafer.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of manufacturing a semiconductor device comprising:
   preparing a semiconductor wafer to include:
      a plurality of IC chips, each of which comprises a circuit formed from a semiconductor element, a terminal for applying an electrical quantity to the circuit, and a switch electrically connected to the terminal; and
      a wire formed between adjacent IC chips, wherein the wire provides a parallel or series electrical connection between each terminal of all of the plurality of IC chips via each switch, determining whether each of the plurality of IC chips formed on the semiconductor wafer is defective;

operating the switch to provide an electrical connection between each terminal of only IC chips that were not determined to be defective and the wire; and performing a conduction test on each circuit of the plurality of IC chips through the wire.

2. The method of claim 1, further comprising:

after performing the conduction test, operating the switch to substantially prevent an electrical connection between each terminal of the IC chips that were not determined to be defective and the wire; and dicing the semiconductor wafer into the plurality of IC chips.

3. The method according to claim 2, wherein:

the preparing of the semiconductor wafer further comprises preparing the switch to include memory transistors, wherein the memory transistors are turned on or off at read-out time of the memory transistors in accordance with whether the memory transistors are under a writing state or erasing state;

the operating of the switch further comprises operating each switch of the plurality of IC chips to perform writing or erasing on the memory transistors; and the performing of the conduction test further comprises performing the turning on or off at read-out time on all the memory transistors of the plurality of IC chips.

4. The method according to claim 1, wherein:

the preparing of the semiconductor wafer further comprises preparing the switch to include memory transistors, wherein the memory transistors are turned on or off at read-out time of the memory transistors in accordance with whether the memory transistors are under a writing state or erasing state;

the operating of the switch further comprises operating each switch of the plurality of IC chips to perform writing or erasing on the memory transistors; and the performing of the conduction test further comprises performing the turning on or off at read-out time on all the memory transistors of the plurality of IC chips.

* * * * *